(12) United States Patent
Lee et al.

(10) Patent No.: US 9,293,343 B2
(45) Date of Patent: Mar. 22, 2016

(54) METHOD OF FORMING PATTERNS OF SEMICONDUCTOR DEVICE

(71) Applicant: Samsung Electronics Co., Ltd., Suwon-si (KR)

(72) Inventors: Do-Haing Lee, Seoul (KR); Il-Sup Kim, Suwon-si (KR); Do-Hyoung Kim, Hwaseong-si (KR); Woo-Cheol Lee, Suwon-si (KR); Hyun-Ho Jung, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/705,969

(22) Filed: May 7, 2015

(65) Prior Publication Data
US 2016/0005615 A1 Jan. 7, 2016

(30) Foreign Application Priority Data

Jul. 2, 2014 (KR) .......................... 10-2014-0082478
Aug. 11, 2014 (KR) .......................... 10-2014-0103864

(51) Int. Cl.
| H01L 21/44 | (2006.01) |
| H01L 21/308 | (2006.01) |
| H01L 21/768 | (2006.01) |

(52) U.S. Cl.
CPC ........ *H01L 21/3086* (2013.01); *H01L 21/3081* (2013.01); *H01L 21/76802* (2013.01); *H01L 21/76877* (2013.01)

(58) Field of Classification Search
USPC ........................................................ 438/666
See application file for complete search history.

(56) References Cited

U.S. PATENT DOCUMENTS

| 7,488,685 | B2 | 2/2009 | Kewley |
| 7,566,593 | B2 | 7/2009 | Chinthakindi et al. |
| 7,666,578 | B2 | 2/2010 | Fischer et al. |
| 7,811,745 | B2 | 10/2010 | Ito et al. |
| 7,994,052 | B1 | 8/2011 | Sutardja et al. |
| 8,227,354 | B2 | 7/2012 | Kim et al. |
| 8,318,603 | B2 | 11/2012 | Lee et al. |
| 8,980,651 | B2 * | 3/2015 | Yue ..................... G03F 7/70466 430/324 |
| 9,156,306 | B2 * | 10/2015 | Pain ....................... B82Y 10/00 |
| 2006/0258109 | A1 * | 11/2006 | Juengling ......... H01L 27/10823 438/301 |
| 2008/0131793 | A1 * | 6/2008 | Lee ..................... H01L 21/0337 430/5 |
| 2009/0127722 | A1 | 5/2009 | Noelscher et al. |
| 2013/0087527 | A1 | 4/2013 | Pain et al. |
| 2013/0256797 | A1 * | 10/2013 | Chang ............. H01L 21/823437 257/347 |

FOREIGN PATENT DOCUMENTS

JP 2008-235462 10/2008

* cited by examiner

*Primary Examiner* — Asok K Sarkar
(74) *Attorney, Agent, or Firm* — Muir Patent Law, PLLC

(57) ABSTRACT

A method of forming patterns of a semiconductor device includes forming a material film on a substrate, forming a hard mask on the material film, forming a first mold mask pattern and a second mold mask pattern on the hard mask, forming a pair of first spacers to cover opposite sidewalls of the first mold mask pattern, and a pair of second spacers to cover opposite sidewalls of the second mold mask pattern, forming a first gap and a second gap to expose the hard mask by removing the first mold mask pattern and the second mold mask pattern, the first gap being formed between the pair of first spacers and the second gap being formed between the pair of second spacers, forming a mask pattern on the hard mask to cover the first gap and expose the second gap, forming an auxiliary pattern to cover the second gap, removing the mask pattern; and forming a hard mask pattern by patterning the hard mask using the first spacers, the second spacers and the auxiliary pattern as a mask.

20 Claims, 15 Drawing Sheets

METHOD OF FORMING PATTERNS OF SEMICONDUCTOR DEVICE

CROSS-REFERENCE TO RELATED APPLICATION

This U.S. non-provisional patent application claims priority under 35 U.S.C. §119 to Korean Patent Application No. 10-2014-0082478 filed on Jul. 2, 2014, and Korean Patent Application No. 10-2014-0103864 filed on Aug. 11, 2014 in the Korean Intellectual Property Office, the disclosure of each of which is hereby incorporated by reference in its entirety.

BACKGROUND

The present disclosure relates to a method of forming patterns of a semiconductor device.

A highly scaled high-integration semiconductor device may be implemented by forming patterns of a semiconductor device, the patterns having a fine width and being spaced from each other by a fine pitch. In order to form the fine patterns of the semiconductor device, there is a need for a technique capable of simultaneously forming various fine patterns while reducing the number of applications of a photolithography process.

SUMMARY

The disclosed embodiments relate to a method of forming patterns of a semiconductor device, and more particularly forming desired patterns at a fine pitch.

However, aspects of the inventive concept are not restricted to the ones set forth herein. The above and other aspects of the inventive concept will become more apparent to one of ordinary skill in the art to which the inventive concept pertains by referencing the detailed description given below.

According to an aspect of the inventive concept, a method of forming patterns of semiconductor device may include forming a material film on a substrate, forming a hard mask on the material film, forming a first mold mask pattern and a second mold mask pattern on the hard mask, forming a pair of first spacers to cover opposite sidewalls of the first mold mask pattern, and a pair of second spacers to cover opposite sidewalls of the second mold mask pattern, forming a first gap and a second gap to expose the hard mask by removing the first mold mask pattern and the second mold mask pattern, the first gap being formed between the pair of first spacers and the second gap being formed between the pair of second spacers, forming a mask pattern on the hard mask to cover the first gap and expose the second gap, forming an auxiliary pattern to cover the second gap, removing the mask pattern; and forming a hard mask pattern by patterning the hard mask using the first spacers, the second spacers and the auxiliary pattern as a mask.

In some embodiments, the forming the mask pattern may include forming a mask film to cover the first spacers and the second spacers, forming a photoresist pattern on the mask film to cover the mask film above the first gap and expose the mask film above the second gap, and forming the mask pattern by patterning the mask film using the photoresist pattern.

In some embodiments, the forming the mask pattern may further include forming an antireflection film on the mask film before forming the photoresist pattern.

In some embodiments, the mask pattern may expose inner sidewalls of the pair of second spacers, and covers outer sidewalls of the pair of second spacers.

In some embodiments, the mask pattern may include a recess to expose the second gap, and the recess has a width equal to or larger than the second gap.

In some embodiments, the mask pattern may include a first mask film pattern to cover the pair of first spacers and the pair of second spacers and a second mask film pattern to cover the first mask film pattern. The first and second mask film patterns may include the recess.

In some embodiments, the forming the auxiliary pattern may include forming an auxiliary film on the second mask film pattern, the auxiliary film filling the recess, and forming the auxiliary pattern by removing the auxiliary film and the second mask film pattern. The first mask film pattern may be exposed.

In some embodiments, the first mask film pattern may be a SOH film pattern, and the second mask film pattern may be a SiON film pattern.

In some embodiments, the pair of first spacers, the pair of second spacers and the auxiliary pattern may include the same material.

In some embodiments, the auxiliary pattern may include silicon oxide.

In some embodiments, the method may further include patterning the material film using the hard mask pattern.

According to another aspect of the inventive concept, a method of forming patterns of a semiconductor device may include forming a hard mask on a substrate, forming a plurality of mold mask patterns on the hard mask, forming a plurality of pairs of spacers on the hard mask, each of the pairs of spacers covering opposite sidewalls of each of the mold mask patterns, exposing the hard mask between each of the pairs of spacers by removing the plurality of mold mask patterns, forming a mask pattern on the hard mask to cover the spacers, the mask pattern exposing the hard mask between inner sidewalls of at least one of the pairs of spacers, forming an auxiliary pattern to cover the exposed hard mask, and removing the mask pattern.

In some embodiments, wherein the forming the mask pattern may include forming a mask film on the hard mask to cover the pairs of spacers, forming a photoresist on the mask film, forming a opening in the photoresist to form a photoresist pattern, the opening may be formed on a region between at least one of the pairs of spacers, and forming the mask pattern using the photoresist pattern.

In some embodiments, the auxiliary pattern and the pairs of spacers may include the same material.

In some embodiments, the auxiliary pattern may include silicon oxide.

According to still another aspect of the inventive concept, a method of forming patterns of a semiconductor device may include forming a material film on a substrate, forming a hard mask on the material film, forming a first mold mask pattern and a second mold mask pattern on the hard mask, forming a pair of first spacers to cover opposite sidewalls of the first mold mask pattern, and a pair of second spacers to cover opposite sidewalls of the second mold mask pattern, forming a first gap and a second gap to expose the hard mask by removing the first mold mask pattern and the second mold mask pattern, the first gap being formed between the pair of first spacers and the second gap being formed between the pair of second spacers, forming a mask pattern on the hard mask to cover the first gap and expose the second gap, forming an auxiliary pattern to cover the second gap, removing the mask pattern, forming a hard mask pattern by patterning the hard mask using the first spacers, the second spacers and the auxiliary pattern as a mask, and forming trenches in the material film by etching the material film using the hard mask pattern as an etching mask.

In some embodiments, the forming the mask pattern may include forming a mask film to cover the first spacers and the second spacers, forming a photoresist pattern on the mask film to cover the mask film above the first gap and expose the mask film above the second gap, and forming the mask pattern by patterning the mask film using the photoresist pattern.

In some embodiments, the method may further include forming wirings in the trenches.

In some embodiments, forming wrings in the trenches may include forming a conductive material to fill the trenches, and performing a planarizing process on the conductive material.

In some embodiments, the auxiliary pattern and the pairs of spacers may include silicon oxide.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
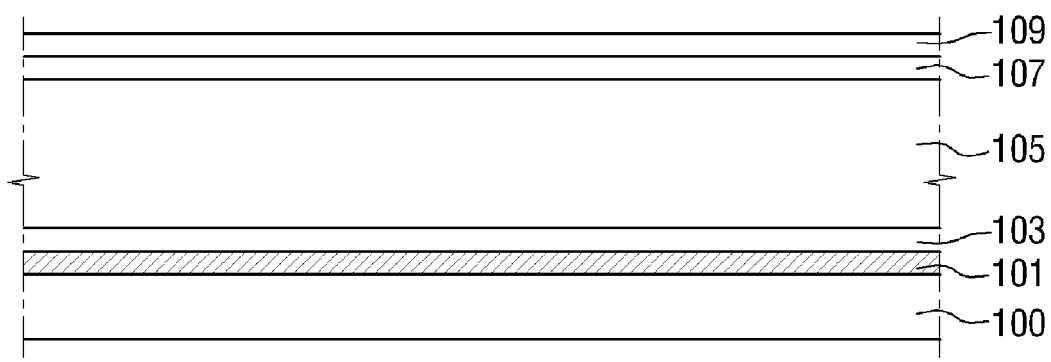
FIGS. 1 to 14 are cross-sectional views showing a process sequence for explaining a method of forming patterns of a semiconductor device according to an embodiment of the inventive concept.

Advantages and features of the inventive concept and methods of accomplishing the same may be understood more readily by reference to the following detailed description of various embodiments and the accompanying drawings. The present inventive concept may, however, be embodied in many different forms and should not be construed as being limited to the embodiments set forth herein. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, or as "contacting" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another region, layer or section, for example as a naming convention. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

A method of forming patterns of a semiconductor device according to one embodiment of the inventive concept will be described with reference to FIGS. 1 to 14.

FIGS. 1 to 14 are cross-sectional views showing a process sequence for explaining a method of forming patterns of a semiconductor device according to one embodiment of the inventive concept.

As used herein, a semiconductor device may refer to any of the various devices such as shown in FIGS. 1-14, and may also refer, for example, to two or more transistors formed on a wafer or a device such as a semiconductor chip (e.g., memory chip and/or logic chip formed on a die or from a wafer), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

Referring to FIG. 1, a first wiring 101, a capping film 103, an interlayer insulating film 105, a barrier film 107, and a hard mask 109 may be sequentially formed on a substrate 100.

The substrate 100 may include a semiconductor material. The substrate 100 may include at least one of, for example, silicon, germanium, silicon germanium (SiGe) and gallium arsenide (GaAs).

The substrate 100 may include a transistor, other elements and the like, for example, at other regions other than the region depicted in FIG. 1.

The first wiring 101 may be formed on the substrate 100. The first wiring 101 may include, for example, Cu, Al or the like.

The capping film 103 may be formed on the first wiring 101. The capping film 103 may cover the first wiring 101 to protect the first wiring 101. The capping film 103 may include, for example, silicon nitride, silicon oxide, silicon oxynitride or the like.

The interlayer insulating film 105 may be formed on the capping film 103. The interlayer insulating film 105 may include, for example, silicon oxide or a low dielectric constant (low-k) material.

The barrier film 107 may be formed on the interlayer insulating film 105. The barrier film 107 may include, for example, silicon nitride, silicon oxide, silicon oxynitride or the like.

The hard mask 109 may be formed on the barrier film 107. In certain embodiments, the hard mask 109 includes metal nitride. For example, the hard mask 109 may include titanium nitride, tantalum nitride, tungsten nitride or the like. Although the hard mask 109 has been illustrated as one layer in the drawings, the inventive concept is not limited thereto. For example, the hard mask 109 may be formed by stacking two or more layers.

Figure 2:
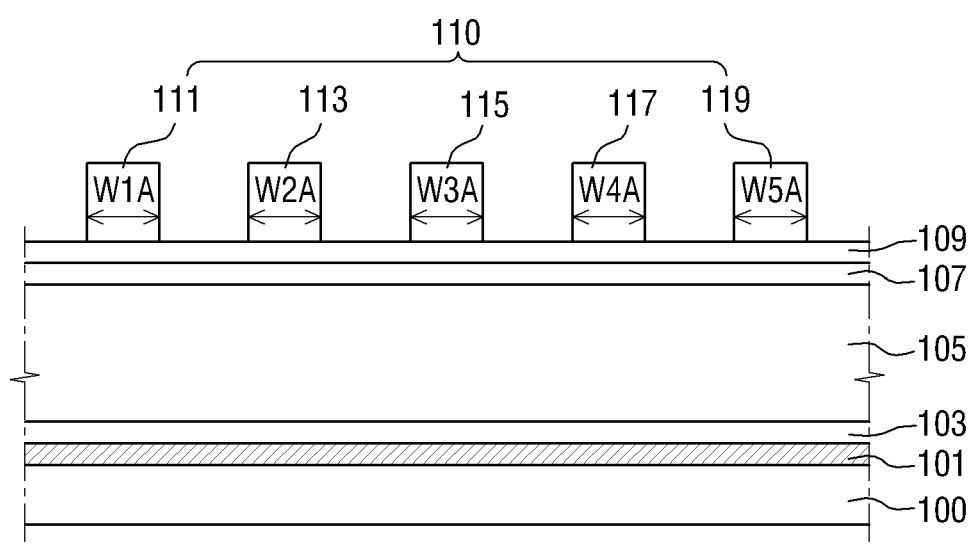

Referring to FIG. 2, a mold mask pattern 110 may be formed on the hard mask 109. The mold mask pattern 110 may be formed to include a plurality of patterns. The mold mask pattern 110 has been illustrated in the drawings as an example to include five mold mask patterns, i.e., first to fifth mold mask patterns 111, 113, 115, 117 and 119, but the inventive concept is not limited thereto, and the number of the patterns included in the mold mask pattern 110 may be four or less, or six or more.

The first to fifth mold mask patterns 111, 113, 115, 117 and 119 are spaced apart from each other. All or some of the first to fifth mold mask patterns 111, 113, 115, 117 and 119 may be spaced apart from each other by the same distance. Alternatively, the first to fifth mold mask patterns 111, 113, 115, 117 and 119 may be spaced apart from each other by different distances.

The first mold mask pattern 111 has a first width W1A, the second mold mask pattern 113 has a second width W2A, the third mold mask pattern 115 has a third width W3A, the fourth mold mask pattern 117 has a fourth width W4A, and the fifth mold mask pattern 119 has a fifth width W5A. The first to fifth widths W1A, W2A, W3A, W4A and W5A may be the same or different from each other. For example, the first width W1A and the second width W2A may be different from each other.

Figure 3:
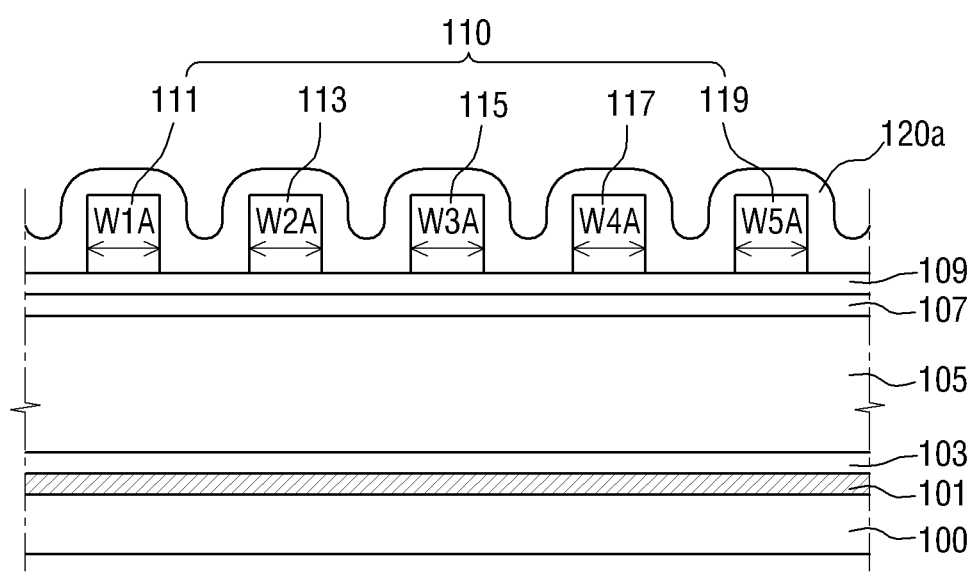

Referring to FIG. 3, a spacer film 120a may be formed to cover a plurality of mold mask patterns 110. The spacer film 120a may cover the upper surfaces and the sidewalls of the mold mask patterns 110.

The spacer film 120a may include, for example, silicon oxide.

Figure 4:
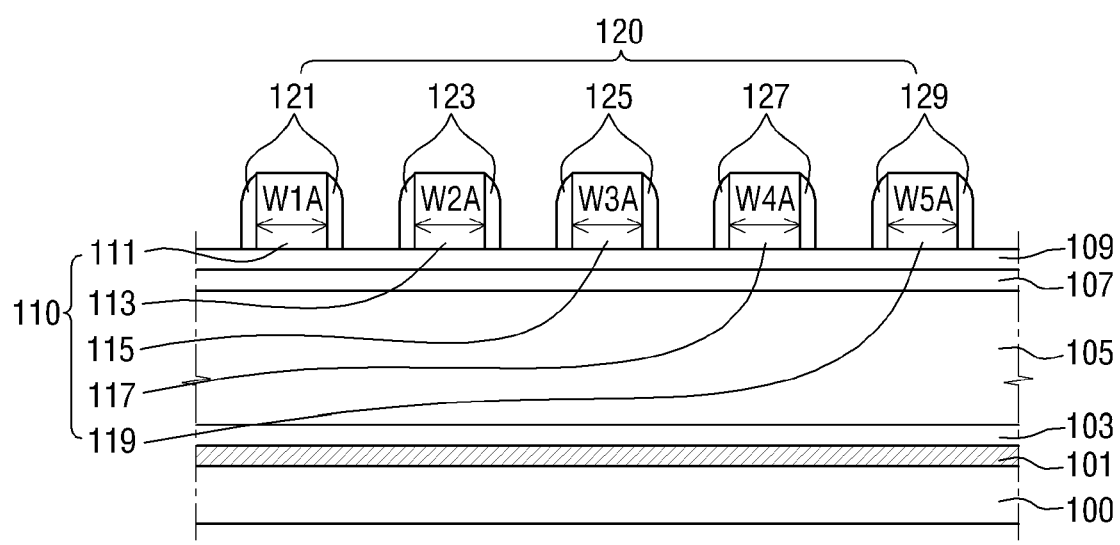

Referring to FIG. 4, a plurality of pairs of spacers 120 may be formed by etching back the spacer film 120a. Specifically, a pair of first spacers 121 may be formed on both sidewalls (e.g., two opposite sidewalls) of the first mold mask pattern 111, a pair of second spacers 123 may be formed on both sidewalls of the second mold mask pattern 113, a pair of third spacers 125 may be formed on both sidewalls of the third mold mask pattern 115, a pair of fourth spacers 127 may be formed on both sidewalls of the fourth mold mask pattern 117, and a pair of fifth spacers 129 may be formed on both sidewalls of the fifth mold mask pattern 119.

Figure 5:
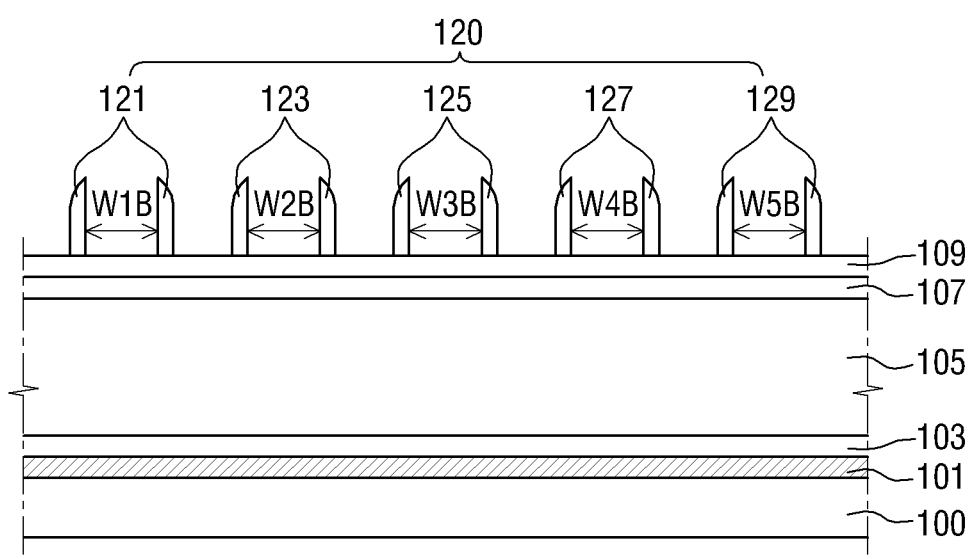

Referring to FIG. 5, the mold mask patterns 110 may be removed. By removing the first to fifth mold mask patterns 111, 113, 115, 117 and 119, only a plurality of pairs of spacers 120 may remain on the hard mask 109.

Upon removing the first to fifth mold mask patterns 111, 113, 115, 117 and 119, the first spacers 121 may be spaced from each other by a first gap W1B, the second spacers 123 may be spaced from each other by a second gap W2B, the third spacers 125 may be spaced from each other by a third gap W3B, the fourth spacers 127 may be spaced from each other by a fourth gap W4B, and the fifth spacers 129 may be spaced from each other by a fifth gap W5B. The widths of the first to fifth gaps W1B, W2B, W3B, W4B and W5B may be determined by the widths W1A, W2A, W3A, W4A and W5A of the first to fifth mold mask patterns, respectively.

By removing the mold mask patterns 110, the hard mask 109 formed thereunder may be exposed.

Figure 6:
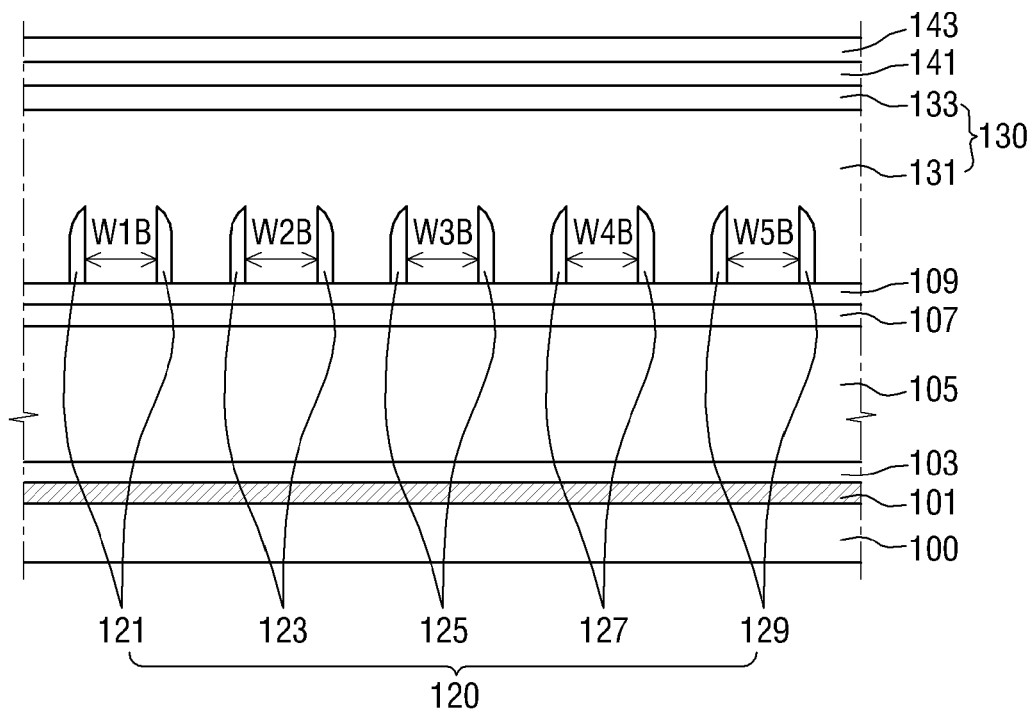

Referring to FIG. 6, a mask film 130 may be formed on the hard mask 109. The mask film 130 may include a spin on hardmask (SOH) film 131 and a SiON film 133. The SOH film 131 may be formed on the hard mask 109 to completely cover the plurality of pairs of spacers 120. The SiON film 133 may be formed on the SOH film 131. The SOH film 131 may be thicker than the SiON film 133.

Subsequently, an antireflection film 141 may be formed on the mask film 130, and a photoresist film 143 may be formed on the antireflection film 141.

Figure 7:
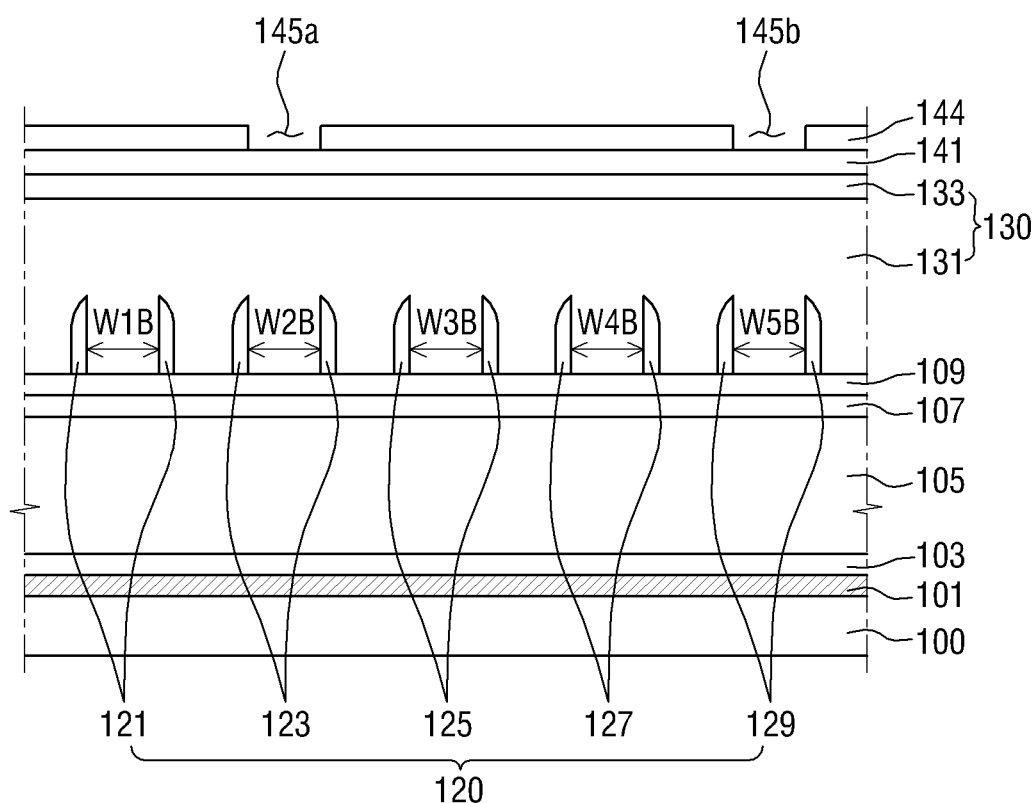

Referring to FIG. 7, the photoresist film 143 may be patterned by using a photolithography process to form a photoresist pattern 144. The photoresist pattern 144 may include openings 145a and 145b. The openings 145a and 145b may be disposed at a portion where an auxiliary pattern 156 (see FIG. 10) will be formed later. For example, the first opening 145a may be formed above and correspond to the second gap W2B, and the second opening 145b may be formed above and correspond to the fifth gap W5B.

When patterning the photoresist film 143, the photoresist pattern may be formed such that the photoresist film 143 remains only above the second gap W2B and the fifth gap W5B. However, the narrower the second gap W2B and the fifth gap W5B, the more difficult to allow the photoresist film 143 to accurately remain above the second gap W2B and the fifth gap W5B. Thus, errors are likely to occur in the process. However, as in the example of FIG. 7, by forming the photoresist pattern 144 to include the first and second openings 145a and 145b, the photoresist pattern 144 can be formed accurately and easily even if the second gap W2B and the fifth gap W5B are narrow.

The antireflection film 141 may prevent light from being reflected from the surface during the photolithography process. Thus, the photoresist pattern 144 can be formed clearly and precisely by the antireflection film 141.

Figure 8:
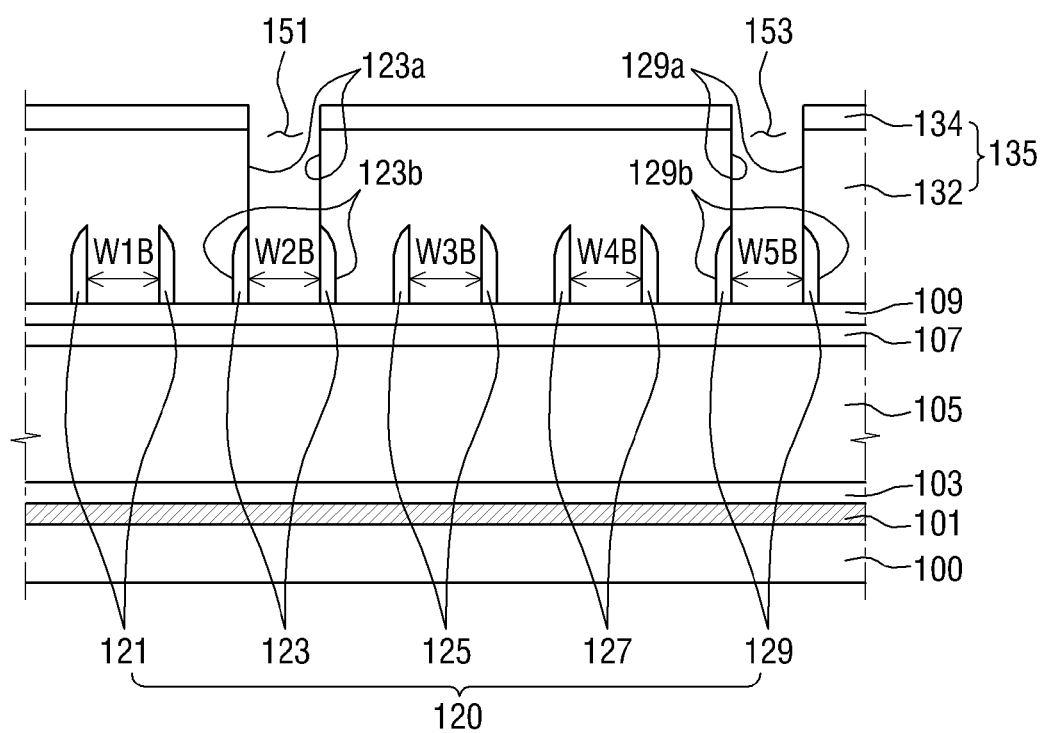

Referring to FIG. 8, a mask pattern 135 including a first recess 151 and a second recess 153 may be formed by using the photoresist pattern 144. Specifically, the first recess 151 and the second recess 153 may be formed by etching the mask film 130 (see FIG. 7) exposed by the first opening 145a and the second opening 145b. For example, a SiON film pattern 134 and a SOH film pattern 132 including the first recess 151 and the second recess 153 may be formed by sequentially etching the SiON film 133 (see FIG. 7) and the SOH film 131 (see FIG. 7). In this case, the mask pattern 135 may include the SiON film pattern 134 and the SOH film pattern 132.

The mask pattern 135 may expose the hard mask 109 between some of the spacers 120. The first recess 151 may expose the second gap W2B, and the second recess 153 may expose the fifth gap W5B.

The width of the first recess 151 may be equal to or larger than that of the second gap W2B. Thus, inner sidewalls 123a of the second spacers 123 may be exposed by the first recess 151. Similarly, the width of the second recess 153 may be equal to or larger than that of the fifth gap W5B. Thus, inner sidewalls 129a of the fifth spacers 129 may be exposed by the first recess 153.

The mask pattern 135 may cover outer sidewalls 123b of the second spacers 123, and may cover outer sidewalls 129b of the fifth spacers 129. For example, if the width of the first recess 151 is equal to the width of the second gap W2B, and the width of the second recess 153 is equal to the width of the fifth gap W5B, as shown in FIG. 8, the mask pattern 135 may completely cover the outer sidewalls 123b and 129b of the second and fifth spacers 123 and 129, respectively.

However, if the width of the first recess 151 is larger than the width of the second gap W2B, and the width of the second recess 153 is larger than the width of the fifth gap W5B, the mask pattern 135 may partially cover the outer sidewalls 123b and 129b of the second and fifth spacers 123 and 129, respectively.

The mask pattern 135 exposes the hard mask 109 only in the second gap W2B and the fifth gap W5B, and does not expose the hard mask 109 of the other portion.

While forming the first and second recesses 151 and 153, the photoresist pattern 144 and the antireflection film 141 may be removed. If the photoresist pattern 144 and the antireflection film 141 partially remain even after forming the first and second recesses 151 and 153, the remaining portion may be removed after forming the first and second recesses 151 and 153.

Figure 9:
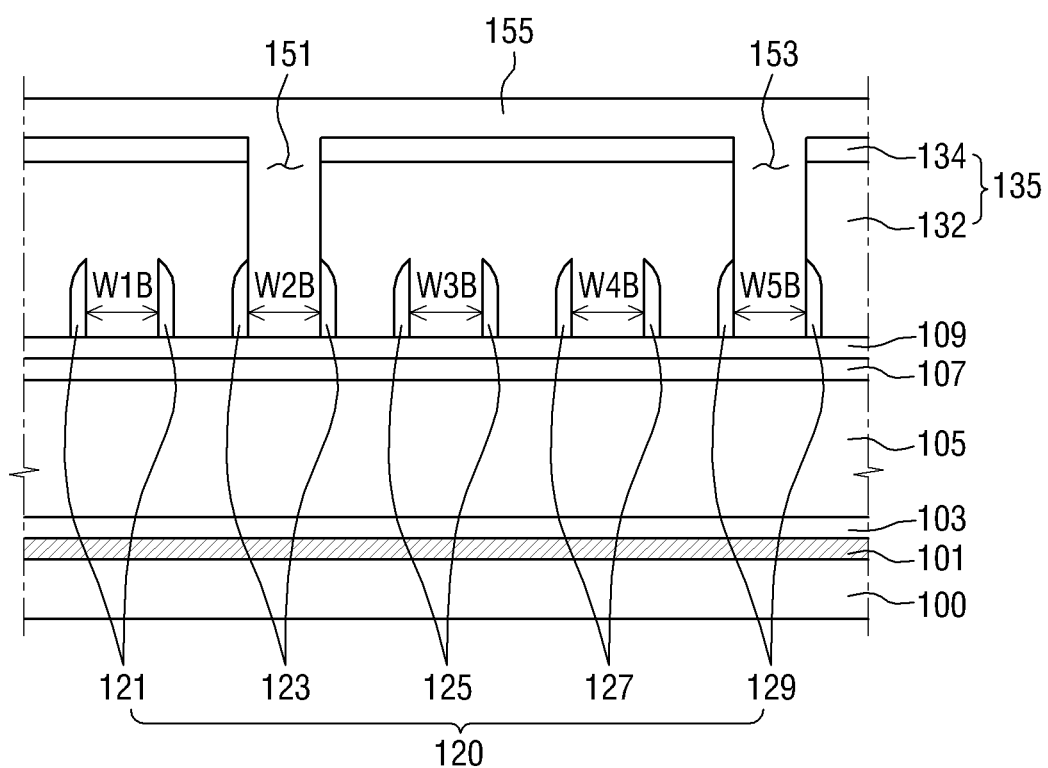

Referring to FIG. 9, an auxiliary film 155 may be formed to cover the exposed hard mask 109. The auxiliary film 155 may be formed on the mask pattern 135 while filling the first and second recesses 151 and 153.

The auxiliary film 155 may be formed by, for example, an atomic layer deposition (ALD) process. For example, the auxiliary film 155 may include silicon oxide. For example, the auxiliary film 155 may include the same material as the spacers 120.

Figure 10:
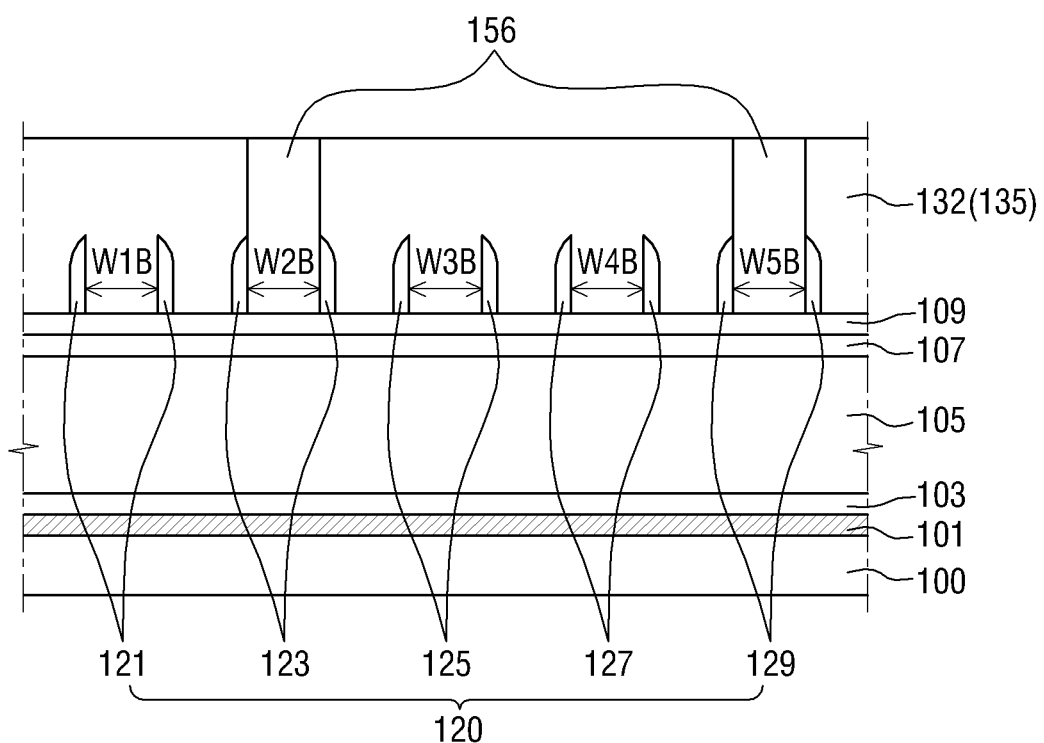

Referring to FIG. 10, an auxiliary pattern 156 may be formed by etching back the auxiliary film 155 (see FIG. 9). The auxiliary pattern 156 may cover the second gap W2B and the fifth gap W5B while filling the first recess 151 and the second recess 153. During the etch-back process of the auxiliary film 155 (see FIG. 9), the SiON film pattern 134 of the mask pattern 135 may be removed, and the SOH film pattern 132 may be exposed. Alternatively, an upper portion of the SOH film pattern 132 may also be removed. According to some embodiments, the SiON film pattern 134 may partially remain without being removed during the formation of the auxiliary pattern 156.

Figure 11:
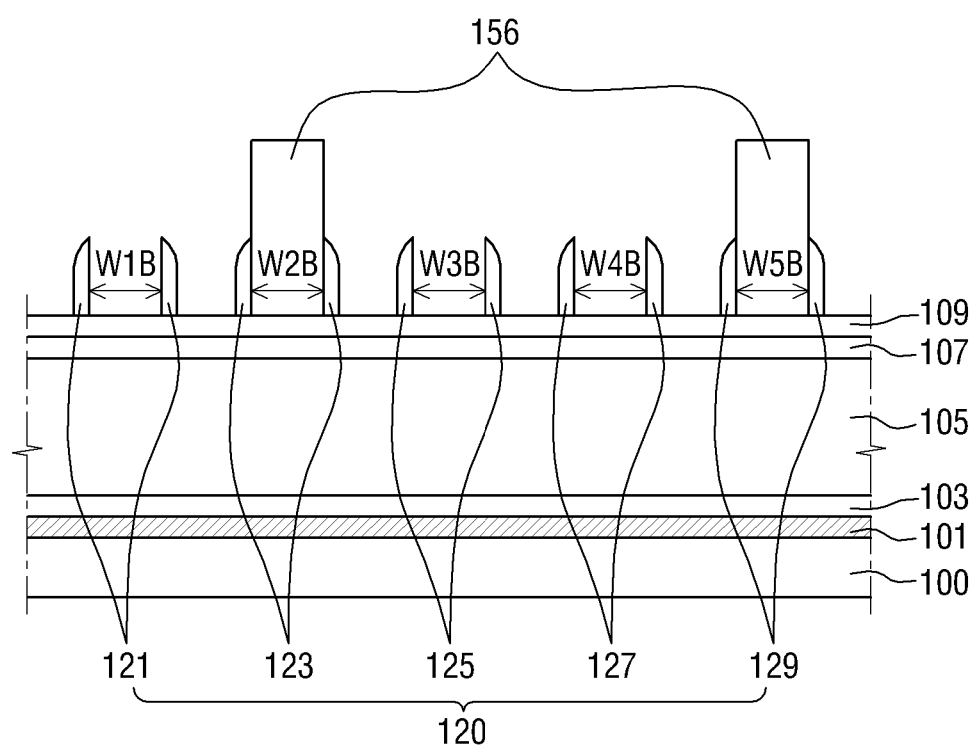

Referring to FIG. 11, the mask pattern 135 may be removed. That is, the remaining SOH film pattern 132 may be removed. The pairs of spacers 120 and the auxiliary pattern 156 may remain on the hard mask 109. The remaining portion of the hard mask 109 except a portion where the pairs of spacers 120 and the auxiliary pattern 156 are disposed may be exposed.

Figure 12:
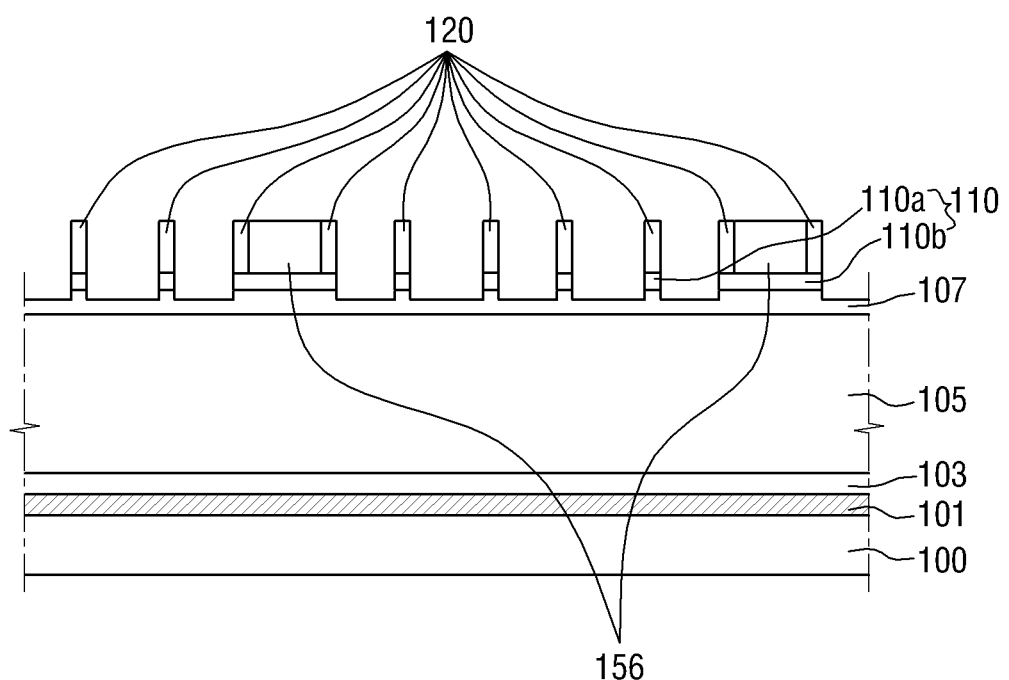

Referring to FIG. 12, the hard mask 109 (see FIG. 11) may be patterned using the pairs of spacers 120 and the auxiliary pattern 156 as a mask. The exposed portion of the hard mask 109 (see FIG. 11), which is not covered by the pairs of spacers 120 and the auxiliary pattern 156, may be patterned to form a hard mask pattern 110. Thus, the hard mask pattern 110 may include a first pattern 110a having a small width and a second pattern 110b having a large width. For example, the first pattern 110a may have substantially the same width as one of a pair of the spacers 120. The second pattern 110b may have substantially the same width as, for example, the sum of the distance of the second gap W2B (see FIG. 11) and the widths of a pair of the second spacers 123 (see FIG. 11), or the sum of the distance of the fifth gap W5B (see FIG. 11) and the widths of a pair of the fifth spacers 129 (see FIG. 11).

While forming the hard mask pattern 110, upper portions of the pairs of spacers 120 and an upper portion of the auxiliary pattern 156 may also be partially etched.

While forming the hard mask pattern 110, as shown in FIG. 12, the barrier film 107 may also be partially etched. The barrier film 107 may be exposed by the hard mask pattern 110, and a portion of the barrier film 107 which is not covered with the hard mask pattern 110 may be etched. Subsequently, the pairs of spacers 120 and the auxiliary pattern 156 may be removed. In some embodiments, the pairs of spacers 120 and the auxiliary pattern 156 may not be removed to remain on the hard mask pattern 110.

Figure 13:
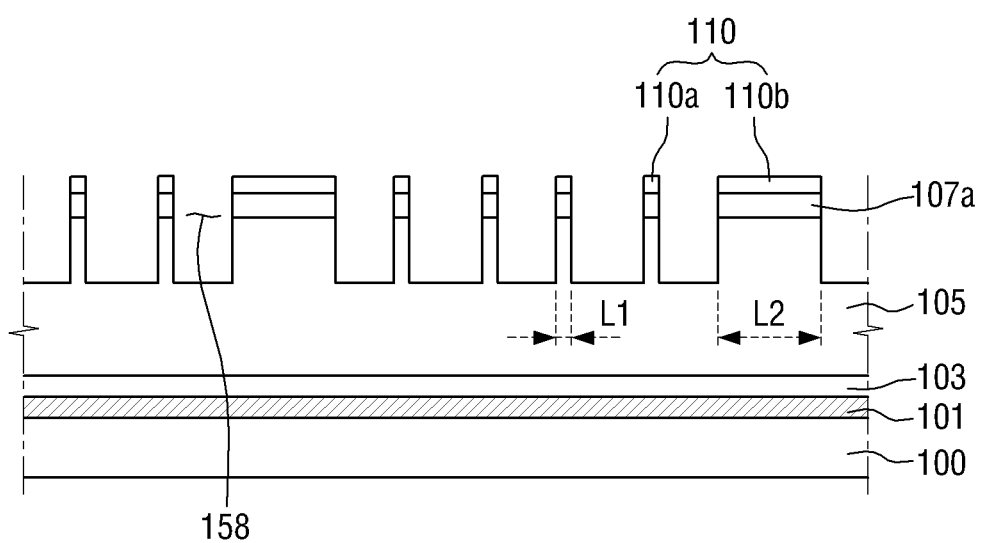

Referring to FIG. 13, the interlayer insulating film 105 may be patterned using the hard mask pattern 110. The barrier film 107 and the interlayer insulating film 105 may be etched using the hard mask pattern 110 as an etching mask to form trenches 158. In some embodiments, the pairs of spacers 120, the auxiliary pattern 156, and the hard mask pattern 110 may be used as the etching mask to etch the barrier film 107 and the interlayer insulating film 105. The barrier film 107 (see FIG. 12) may be etched to form a barrier pattern 107a. The trenches 158 may be spaced from each other by different distances according to the hard mask pattern 110. For example, some of the trenches 158 may be spaced from each other by substantially the same distance, i.e., a first distance L1 that is a small distance, corresponding to the width of the first hard mask pattern 110a, but some of the trenches 158 may be spaced from each other by a second distance L2 larger than the first distance L1 corresponding to the width of the second hard mask pattern 110b.

Figure 14:
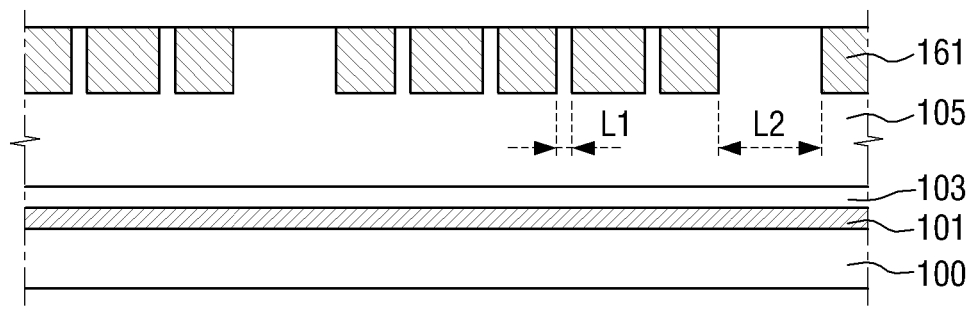

Referring to FIG. 14, second wirings 161 may be formed by filling the trenches 158 formed in the interlayer insulating film 105 with a conductive material. For example, the conductive material may be formed to cover the hard mask pattern 110 and fill the trenches 158, and the second wirings 161 filling the trenches 158 may be formed by performing a planarization process on the conductive material. For example, the planarization process may include a chemical mechanical polishing (CMP) process.

During the planarization process, the hard mask pattern 110 and the barrier pattern 107a may be removed. In some embodiments, the conductive material may be formed to fill the trenches 158 and cover the pairs of spacers 120, the auxiliary pattern 156, and the hard mask pattern 110, and the conductive material may be planarized by a planarization process to form the second wirings 161 filling the trenches 158. During the planarization process, the pairs of spacers 120, the auxiliary pattern 156, the hard mask pattern 110 and the barrier pattern 107a may be removed. The second wirings 161 may be arranged in various forms according to the shapes of the trenches 158. For example, some of the second wirings 161 may be spaced from each other by substantially the same distance, i.e., the first distance L1, and some of the second wirings 161 may be spaced from each other by the second distance L2 larger than the first distance L1.

Figure 15:
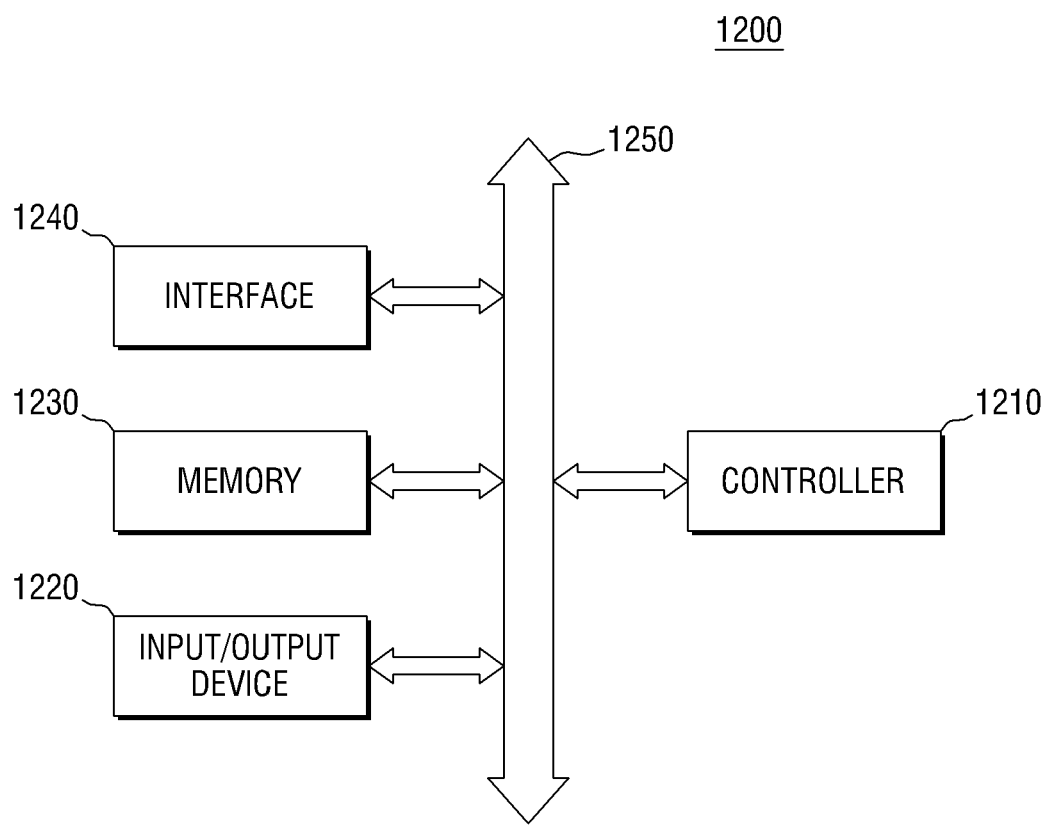
FIG. 15 is a diagram showing certain parts of an electronic system according to an embodiment of the inventive concept.

FIG. 15 is a diagram showing main parts of an electronic system 1200 according to an embodiment of the inventive concept.

The electronic system 1200 includes a controller 1210, an input/output device 1220, a memory 1230 and an interface 1240. The electronic system 1200 may be an electronic device such as a mobile system or a system transmitting or receiving information. In some embodiments, the mobile system is at least one of a personal digital assistant (PDA), a portable computer, a web tablet, a wireless phone, a mobile phone, a digital music player and a memory card.

In some embodiments, the controller 1210 is a microprocessor, a digital signal processor, or a micro-controller.

The input/output device 1220 is used for input/output of data of the electronic system 1200. The electronic system 1200 may be connected to an external device, for example, a personal computer or a network, by using the input/output device 1220 to exchange data with the external device. In some embodiments, the input/output device 1220 is a keypad, a keyboard, or a display device.

In some embodiments, the memory 1230 stores codes and/or data for the operation of the controller 1210. In another embodiment, the memory 1230 stores data processed by the controller 1210. At least one of the controller 1210 and the memory 1230 includes at least one of semiconductor devices fabricated according to above-described embodiments.

The interface 1240 serves as a data transmission path between the electronic system 1200 and other external devices. The controller 1210, the input/output device 1220, the memory 1230 and the interface 1240 may communicate with each other via a bus 1250.

The electronic system 1200 may be included in an electronic device such as a mobile phone, a MP3 player, a navigation system, a portable multimedia player (PMP), or a household appliance.

While the present disclosure has been particularly shown and described with reference to exemplary embodiments thereof, it will be understood by those of ordinary skill in the art that various changes in form and details may be made to these embodiments without departing from the spirit and scope of the inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A method of forming patterns of a semiconductor device, comprising:
    forming a material film on a substrate;
    forming a hard mask on the material film;
    forming a first mold mask pattern and a second mold mask pattern on the hard mask;
    forming a pair of first spacers to cover opposite sidewalls of the first mold mask pattern, and a pair of second spacers to cover opposite sidewalls of the second mold mask pattern;
    forming a first gap and a second gap to expose the hard mask by removing the first mold mask pattern and the second mold mask pattern, the first gap being formed between the pair of first spacers and the second gap being formed between the pair of second spacers;
    forming a mask pattern on the hard mask to cover the first gap and expose the second gap;
    forming an auxiliary pattern to cover the second gap;
    removing the mask pattern; and
    forming a hard mask pattern by patterning the hard mask using the first spacers, the second spacers and the auxiliary pattern as a mask.

2. The method of claim 1, wherein the forming the mask pattern comprises:
    forming a mask film to cover the first spacers and the second spacers;
    forming a photoresist pattern on the mask film to cover the mask film above the first gap and expose the mask film above the second gap; and
    forming the mask pattern by patterning the mask film using the photoresist pattern.

3. The method of claim 2, wherein the forming the mask pattern further comprises, before forming the photoresist pattern, forming an antireflection film on the mask film.

4. The method of claim 1, wherein the mask pattern exposes inner sidewalls of the pair of second spacers, and covers outer sidewalls of the pair of second spacers.

5. The method of claim 4, wherein the mask pattern includes a recess to expose the second gap, and the recess has a width equal to or larger than the second gap.

6. The method of claim 5, wherein the mask pattern includes a first mask film pattern to cover the pair of first spacers and the pair of second spacers and a second mask film pattern to cover the first mask film pattern, and the first and second mask film patterns include the recess.

7. The method of claim 6, wherein the forming the auxiliary pattern comprises:
    forming an auxiliary film on the second mask film pattern, the auxiliary film filling the recess; and
    forming the auxiliary pattern by removing the auxiliary film and the second mask film pattern, the first mask film pattern is exposed.

8. The method of claim 7, wherein the first mask film pattern is a SOH film pattern, and the second mask film pattern is a SiON film pattern.

9. The method of claim 1, wherein the pair of first spacers, the pair of second spacers and the auxiliary pattern include the same material.

10. The method of claim 1, wherein the auxiliary pattern includes silicon oxide.

11. The method of claim 1, further comprising patterning the material film using the hard mask pattern.

12. A method of forming patterns of a semiconductor device, comprising:
    forming a hard mask on a substrate;
    forming a plurality of mold mask patterns on the hard mask;
    forming a plurality of pairs of spacers on the hard mask, each of the pairs of spacers covering opposite sidewalls of each of the mold mask patterns;
    exposing the hard mask between each of the pairs of spacers by removing the plurality of mold mask patterns;

forming a mask pattern on the hard mask to cover the spacers, the mask pattern exposing the hard mask between inner sidewalls of at least one of the pairs of spacers;

forming an auxiliary pattern to cover the exposed hard mask; and removing the mask pattern.

13. The method of claim 12, wherein the forming the mask pattern comprises:

forming a mask film on the hard mask to cover the pairs of spacers;

forming a photoresist on the mask film;

forming a opening in the photoresist to form a photoresist pattern, the opening being formed on a region between at least one of the pairs of spacers; and forming the mask pattern using the photoresist pattern.

14. The method of claim 12, wherein the auxiliary pattern and the pairs of spacers include the same material.

15. The method of claim 12, wherein the auxiliary pattern includes silicon oxide.

16. A method of forming patterns of a semiconductor device, comprising:

forming a material film on a substrate;

forming a hard mask on the material film;

forming a first mold mask pattern and a second mold mask pattern on the hard mask;

forming a pair of first spacers to cover opposite sidewalls of the first mold mask pattern, and a pair of second spacers to cover opposite sidewalls of the second mold mask pattern;

forming a first gap and a second gap to expose the hard mask by removing the first mold mask pattern and the second mold mask pattern, the first gap being formed between the pair of first spacers and the second gap being formed between the pair of second spacers;

forming a mask pattern on the hard mask to cover the first gap and expose the second gap;

forming an auxiliary pattern to cover the second gap;

removing the mask pattern;

forming a hard mask pattern by patterning the hard mask using the first spacers, the second spacers and the auxiliary pattern as a mask; and forming trenches in the material film by etching the material film using the hard mask pattern as an etching mask.

17. The method of claim 16, wherein the forming the mask pattern comprises:

forming a mask film to cover the first spacers and the second spacers;

forming a photoresist pattern on the mask film to cover the mask film above the first gap and expose the mask film above the second gap; and forming the mask pattern by patterning the mask film using the photoresist pattern.

18. The method of claim 16, further comprising forming wirings in the trenches.

19. The method of claim 16, wherein forming wrings in the trenches comprises:

forming a conductive material to fill the trenches; and performing a planarizing process on the conductive material.

20. The method of claim 16, wherein the auxiliary pattern and the pairs of spacers include silicon oxide.

* * * * *